United States Patent [19]

Mizushima et al.

[11] 4,341,954
[45] Jul. 27, 1982

[54] PHOTO-ELECTRIC CONVERTING APPARATUS

[75] Inventors: Yoshihiko Mizushima, Fuchu; Akitsu Takeda, Tokyo; Kazumi Komiya, Yokosuka; Masahiro Sakaue, Hachiohji; Toshio Ogino, Higashiyamato; Hideo Itoh, Tokyo; Masayoshi Oka, Kashiwa, all of Japan

[73] Assignees: Nippon Telegraph & Telephone Public Corp.; Origin Electric Co., Ltd., both of Tokyo, Japan

[21] Appl. No.: 118,907

[22] Filed: Feb. 6, 1980

[51] Int. Cl.³ .............................................. H01J 40/14
[52] U.S. Cl. .................................. 250/211 J; 357/16; 357/30
[58] Field of Search .................. 250/211 J; 357/16, 30

[56] References Cited
PUBLICATIONS

Butsuri, "Applied Physics of Japan", vol. 45, No. 11, 1976, p. 65.

Primary Examiner—David C. Nelms
Assistant Examiner—Darwin R. Hostetter
Attorney, Agent, or Firm—Brumbaugh, Graves, Donohue & Raymond

[57] ABSTRACT

A photo-electric converting apparatus comprises an array wherein a plurality of photo-electric converting elements are provided, each of which having a semiconductor film layer arranged between an electrode layer and another electrode layer formed on a substrate, and having at least either a rectifying contact or a P-N junction. When the array is irradiated with light under such condition that substantially no bias voltage is applied between the electrode layers of the array, each of the photo-electric converting elements produces forward e.m.f., and forward current flows. A capacitive means in each of the photo-electric converting elements is charged with the forward current, and the capacitive means are discharged successively by scanning pulses, and timed pulse signals are outputted. The present invention discloses further various concrete constructions of the photo-electric converting element and the array thereof with high efficiency of conversion.

8 Claims, 19 Drawing Figures

PHOTO-ELECTRIC CONVERTING APPARATUS

RELATED REFERENCES

This application is related to following patents and a magazine publication.
U.S. Pat. No. 3,488,508,
U.S. Pat. No. 3,493,812,
U.S. Pat. No. 3,522,435,
U.S. Pat. No. 3,544,713,
U.S. Pat. No. 3,668,408,
U.S. Pat. No. 3,679,826,
U.S. Pat. No. 3,704,375,
U.S. Pat. No. 3,900,883,
U.S. Pat. No. 3,966,512,
U.S. Pat. No. 4,064,522, and
Oyo Butsuri (APPLIED PHYSICS OF JAPAN) vol. 45, No. 11, 1976, page 65.

BACKGROUND OF THE INVENTION

This invention relates to a photo-electric conversion and more particularly to a photo-electric element and an array formed thereby suitable for a photosensitive sensor, a photo-electric image pick up tube and a photo-electric cell which are used for the OCR apparatus (Optical Character Reader) or the like employed in the terminals of a computer or a facsimile.

Heretofore, an integrated silicon device having a number of photodiodes and the driving circuits thereof was mainly used as a photo-electric converting device of photosensitive sensor of the facsimile apparatus or the like. Where characters or the like in original are to be detected through the facsimile, the image of the original was projected in a reduced size onto an integrated photo-electric converting array by means of an optical means such as a lens. Due to the necessity of employing of such optical means, it was difficult to miniaturize the whole of the apparatus and, because of use of monocrystalline silicon, the apparatus was expensive.

Figure 1:
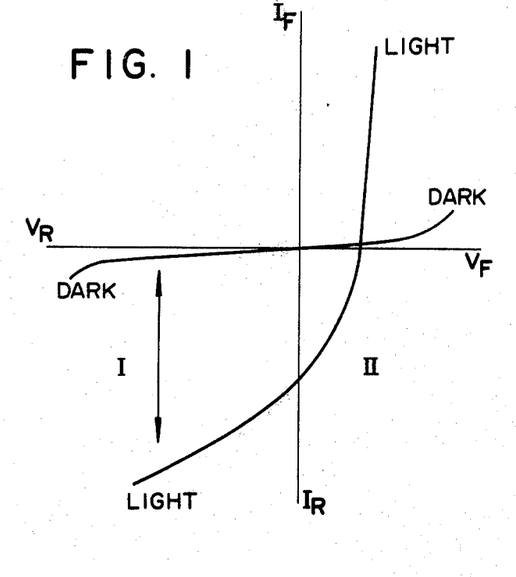
FIG. 1 shows the voltage-current characteristic of a conventional photo-electric converting apparatus.

In order to solve the problems as discussed above, exploitation of one-dimensional or two-dimensional photo sensor which senses the object to be sensed such as the original in a position very closed to it, by the dimensions ratio of about 1:1, and which is of substantially the same size as that of the object to be sensed, has long been desired but no such photo sensor with satisfactory characteristics has yet been exploited. Heretofore the photo sensor comprising of a material, such as amorphous chalcogenide material was developed. It utilized changes in the backward current with respect to the light irradiation under the condition where the rectifying backward biasing voltage is applied, as shown by the range "I" in FIG. 1. It was found, however, that in such a photo-electric converting apparatus which carries out sensing under the condition where the backward biasing voltage is applied, higher S/N ratio is not achieved due to the flow of the dark current; the apparatus necessitates the backward biasing circuit; and should the amorphous chalcogenide layer reached to the temperature of the order of 60° C.-70° C., it would be crystallized. Due to these drawbacks that are always accompanied by the apparatus as discussed above, it was not possible to obtain a high reliability for the apparatus. It is to be noted that all of the photo sensors heretofore available employing semiconductor materials other than the aforementioned amorphos chalcogenide, also utilize the backward voltage with respect to the light irradiation under the state of the rectifying backward biasing.

Figure 2:
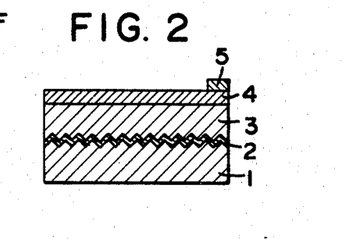
FIG. 2 shows a cross-sectional view of a conventional selenium photocell.

Of the semiconductor materials to be used for the photo sensor, a semiconductor having a hetero-junction of selenium (Se) and cadmium selenide (CdSe) is heretofore known, the semiconductor is comparatively reasonable in price, and excellent in its conversion efficiency, and such semiconductor has already been used for a photo-cell. As is shown in FIG. 2, such photo-cell is produced by the following steps: the surface of an iron or aluminium substrate 1 is roughened by a sandblast or the like to obtain good adhesion of a selenium layer, to the substrate, then a nickel plated layer 2 is provided on the substrate, then a selenium layer 3 is formed by a vacuum deposition on the layer 2, then a transparent electrode 4 is formed by a thin deposition of cadmium or the like by means of a vacuum deposition, and a collecting electrode 5 is formed around the transparent electrode 4. The photo-cell with such construction, however, involves the problems as follows.

The first problem is that, due to the roughened surface of the substrate, there is roughness of from 10 $\mu$m to a few tens $\mu$m, so it necessitated a selenium layer of from 50 to 60 $\mu$m in order to obtain a flat surface of the selenium layer. This results in the increase in the internal resistance which is not preferable to the photo-electric converting element and the array thereof.

The second problem is that, due to the heavy selenium layer, fine fabrication is not available. The area of the selenium layer should critically be about 1 mm$^2$ and it is extremely difficult to obtain the photo-electric converting element and the array thereof which will satisfy the requirement as intended by the present invention.

The third problem is that, due to the use of non-transparent substrate, the incident direction of the light is limited to one direction and, particularly the material for the transparent electrode should be cadmium only, therefore it is not possible to satisfy the requirements of decreasing in the electric resistance and increasing in the transparency, both are in conflict with each other.

An additional drawback in the photo-electric converting device heretofore exploited is that where a substrate with a flat surface particularly a sheet of glass or the like is used, a selenium layer deposited on the substrate will be caused to peel off the substrate when the layer is crystallized and, hence, it is not possible to fixedly deposit the selenium layer on the substrate. In order to overcome this problem, it has been carried out to form the selenium layer followed by the deposition of tellurium onto the glass substrate. Even in such a construction, the thickness of the selenium layer is limited and, further, the internal resistance is increased by the tellurium deposited.

SUMMARY OF THE INVENTION

A principal object of the present invention is to improve the effect of photo-electric conversion.

Another object of the present invention is to provide a photo-electric converting apparatus which will not produce dark current with substantially no external voltage being applied and which provides higher S/N ratio.

Still another object of the present invention is to simplify the construction of the external circuit of the photo-electric converting array without the necessity of the external voltage.

Still another object of the present invention is to produce substantially reproducible output by utilizing the e.m.f. produced by light, the characteristics of which are to be nearly determined by the constituent materials of the element and the array thereof.

Still another object of the present invention is to considerably minimize the influence of variation of characteristics of the device and the aging effect so as to improve the reliability, without use of backward bias.

Still another object of the present invention is to provide a photo-electric converting element and array upon which the light may be impinged either from its front or rear side by selecting of electrode materials, electrode configurations or the like.

Still another object of the present invention is to provide a photo-electric converting array which does not require that each of the photo-electric converting elements is insulated or separated with respect to another.

Still another object of the present invention is to provide a method for effectively manufacturing a photo-electric converting element and array of the type as aforementioned.

Still another object of the present invention is to provide a photosensor as well as a photosensor array which are of excellent in photo-electric converting characteristics and are relatively reasonable in price.

Still another object of the present invention is to provide a photocell consisting of thin films, providing higher efficiency in the photo-electric conversion and larger area of the cell.

BRIEF DESCRIPTION OF THE DRAWINGS

Other objects and advantages of the present invention will be more apparent from the following detailed description of the invention taken in conjunction with the accompanying drawings, wherein:

FIG. 15 shows a further embodiment of the photo-electric converting apparatus of the invention.

DESCRIPTION OF THE PREFERRED EMBODIMENT OF THE INVENTION

Figure 3:
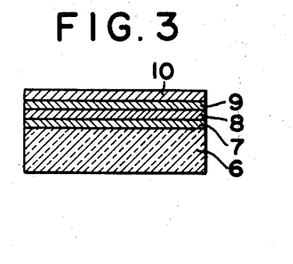
FIG. 3 shows a cross-sectional view of a photo-electric converting element according to one embodiment of the present invention.

Referring to FIG. 3, a thin transparent electrode layer is deposited on a transparent substrate 6 having a flat surface such as a glass plate by means of sputtering or vacuum deposition to form a transparent electrode 7. Then a cadmium selenide layer 8 is formed on the transparent electrode 7, by means of vacuum deposition or the like, and if desired, the cadmium selenide layer 8 so formed may be heat treated or activated in order to improve the photoconductivity. In this connection, if the thickness of the cadmium selenide layer 8 is less than 0.01 $\mu$m, it may happen that cracking occurs in that layer to make it an island-like configuration or pinholes occur, whereby the uniformity of the layer 8 will be affected. In addition, where the heat treatment is to be effected, the uniformity of the layer 8 will be further affected because of the occurrence of crystallization and growth of cadmium selenide. Conversely, if the thickness of the layer 8 is more than that required, it leads to increase in the internal resistance of the photo-electric converting element. Therefore the thickness of the layer of about 2 $\mu$m is preferable. Then, a selenium layer designated by the reference numeral 9 is formed on the layer 8. In this instance, if the temperature of the substrate is low, selenium is non crystallized, whilst if the temperature of the substrate is high, selenium is crystallized. In either case, in order to improve the characteristics of the hetero-junction between the selenium layer 9 and the cadmium selenide layer 8, selenium layer 9 will be subjected to heat treatment for about ten minutes to two hours at a temperature of over 180° C. but under the melting point of selenium. In this regard, if the selenium layer is conventionally provided directly onto a glass or transparent electrode and then crystallized, it would peel off from the transparent electrode as is well known. In accordance with the present invention, however, the selenium layer 9 is provided on the substrate through the intervention of the cadmium selenide layer 8 therebetween, so that the selenium layer 9 after heat treatment will be prevented from coming off the substrate. But, in case where the thickness of the selenium layer 9 is less than 0.01 $\mu$m, there will arise a problem of uniformity of the layer 9 being affected as in the case of the cadmium selenide layer 8. Conversely, where the thickness of the layer 9 is more than a few tens of μm, there will also arise a problem of cracking in some portions of the layer and/or partial peeling thereof, the formation of the selenium layer thus being affected, even if the cadmium selenide layer is provided as mentioned above. Therefore a thickness of the layer of under about 5 μm is preferable in order to obtain a stable layer. A thickness of under about 5 μm is also preferable in view of that the resistance of the selenium layer increases in proportion to the thickness thereof. It is now to be noted that the possibility of occurrence of cracking caused by the crystallization process discussed below can be minimized, provided the layer having a reasonable thickness. From the foregoings, the most preferable range of the thickness of the selenium layer will practically be 0.01 to 4 μm.

Now, the crystallized selenium layer 9 has been prevented from peeling off, there still remains a problem in that where the aforementioned heat treatment is carried out with the selenium layer 9 being left as it was formed, cracking occurs in the crystallized selenium layer due to contraction or the like caused by the crystallization of selenium, and such cracking grows. This results in fatal defects for the photo-electric converting element or the array thereof, so that if the electrode is provided on the selenium layer, the electrode may be short-circuited through the cracking of the selenium layer to its under layer and non-uniformity in photo-electric conversion may result. In order to overcome these problems, an electrode 10 which is of material such as tellurium or gold is provided on the selenium layer 9 immediately after the formation of that layer 9 but before the heat treatment, the electrode 10 makes Ohmic contact with the selenium layer, and thereafter, heat treatment of the selenium layer is carried out at a temperature of over 180° C. but below the melting point of selenium to form the stable and uniform selenium layer. The selenium layer in this instance includes selenium as its main component. It may be added to the selenium layer a small quantity of halogen, thallium and other impurities which are of the kind to be added to selenium of an ordinary selenium rectifier or the like. In the prior selenium rectifier, it has been the practice that after the formation of a selenium layer, a layer consisting of cadmium or alloy thereof is provided thereon and then the heat treatment is carried out. In this case, the selenium layer is of thickness of 50 to 60 μm and, therefore, no significant cracking will practically occur. The heat treatment in this instance is to form a junction consisting of cadmium selenide as the main component in the interface between the selenium layer and the electrode layer, therefore the effect of this heat treatment is quite different from that of the present invention.

In this way, the photo-electric converting element and/or the array thereof comprising of thin films and utilizing mainly a hetero-junction of selenium and cadmium selenide is provided in accordance with the present invention and, accordingly, it becomes possible to perform the fine machining in the micron accuracy.

Reference will now be made to a preferred embodiment of the present invention.

Figure 4:
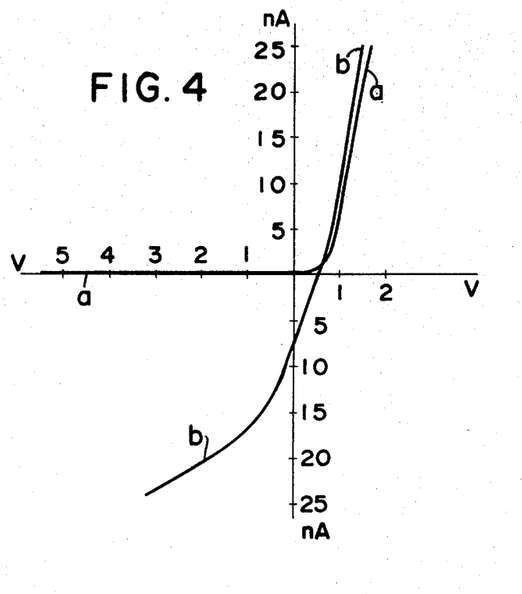
FIG. 4 shows the voltage-current characteristic of the photo-electric converting element according to one embodiment of the present invention.

A cadmium selenide layer is provided on a planar glass substrate of transparent electrode containing indium oxide as a principal component, by means of vacuum deposition in the thickness of 0.2 μm, then a crystallized selenium layer is formed on the cadmium selenide layer in similar manner in the thickness of 0.5 μm and further a gold layer is vacuum deposited on the selenium layer in the thickness of 2 μm so as to form an electrode. In FIG. 4 the characteristics of the photo-electric converting element thus formed with the dimensions of 0.1×0.2 mm is graphically shown. In this graph, a curve "a" shows voltage-current characteristic of the element under the condition where the element is not irradiated and a curve "b" shows voltage-current characteristic of the element under the condition where the element is irradiated by a daylight fluorescent lamp with the illuminance of 500 lux. It will be apparent in FIG. 4 that the photo-electric converting element of the type disclosed provides higher photo sensitivity, e.m.f. caused by the light, and short-circuited current than that of the conventional selenium photo-electric cell.

It has been found that similar characteristics are also provided by a photo-electric converting element utilizing thin films of the amorphous silicon having a P-N junction formed by means of plasma CVD (Chemical Vapor Deposition) through glow discharge or of sputtering. The preferred embodiment thereof will be apparent from the following description.

A transparent electrode containing indium oxide as a principal component is formed on a transparent substrate having a flat surface such as a glass plate, in a preselected pattern. The substrate is heated in an atmosphere of argon which is reduced in pressure to 0.1 torr and to which is added borane of about 3% and silane of about 10%, up to a temperature of about 300° C., then glow discharge is established between said transparent electrode and its opposed electrode, whereby a p-type amorphous silicon layer is formed on said transparent electrode. When the thickness of the layer reaches to about 300 A, the atmosphere is replaced with an atmosphere which is containing argon and to which is added silane of the order of 10%, and glow discharge is established again. When the thickness of a I-type amorphous silicon layer formed by this process reaches to about 9400 A, the atmosphere is further replaced with an atmosphere which is containing argon and to which is added phosphin of the order of 3% and silane of the order of 10%, then glow discharge is established again whereby a N-type amorphous silicon layer is formed in the order of 300 A. In this way, a PIN-junction of amorphous silicon is formed. If desired, unless portions of the amorphous silicon layer formed on each of the electrodes may be removed by the fluoric acidnitric acid etchants. Thereafter, aluminium is vacuum deposited onto the amorphous silicon layer to form an electrode. The photoelectric converting element thus obtained provides excellent characteristics similar to that of the aforementioned hetero-junction between the crystallized selenium and the cadmium selenide, as shown in FIG. 4.

In the above-mentioned embodiment, an ohmic contact is made between the transparent electrode and the semiconductor material. It is to be noted that a photo-electric converting element of the type including a Schottky barrier between the transparent electrode and the semiconductor material also provides excellent photo-electric converting characteristics.

Reference will now be made to an embodiment of a photo-electric converting array by way of FIG. 5.

Figure 5:
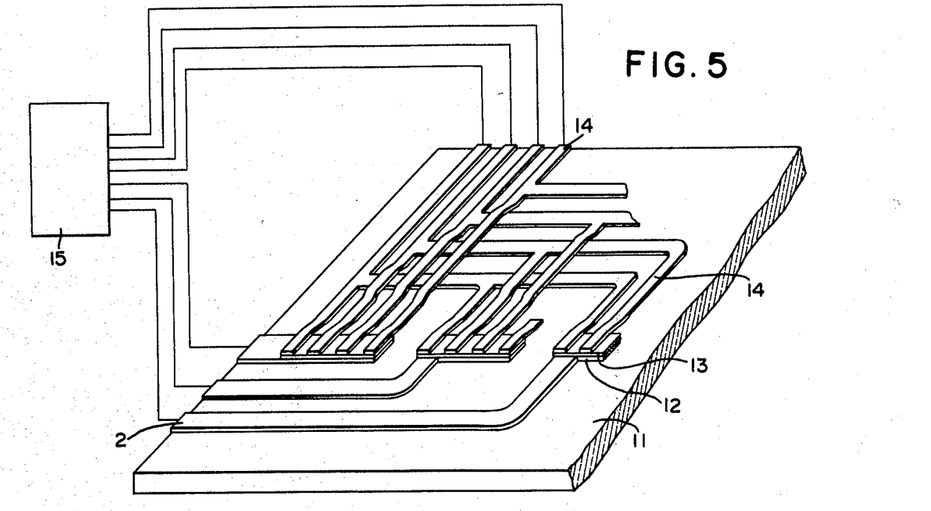
FIG. 5 shows a fragmental perspective view of a photoelectric converting array according to the present invention.
Figure 6:
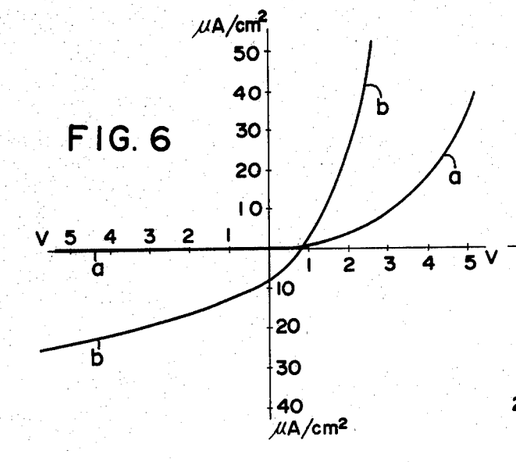
FIGS. 6 and 7 show the voltage-current characteristics respectively referring to different embodiments of photo-electric converting array according to the present invention.

In FIG. 5, a transparent electrode 12 is provided on a glass substrate 11 in a preselected pattern, said electrode is containing tin oxide as a principal component and is divided into plural sections. The transparent electrode 12 is subjected to a predetermined surface treatment so that a satisfactory Schottky barrier may be formed between the electrode 12 and the semiconductor film to be discussed later. In the next step, an amorphous selenium thin layer of 100 A to 200 A (not shown) is formed on the transparent electrode 12 with its surface stabilized, to form a Schottky barrier. Then a selenium amorphous chalcogenide layer 13 containing 5 to 40% arsenic, germanium, sulfur or the like by weight, is deposited on the amorphous selenium thin layer, and an electrode 14 of gold or tellurium is provided thereon in a preselected pattern to form a photo-electric converting array. In this regard the amorphous selenium layer may be excluded if desired, but in this instance leakage current would be increased to some degree. In such a case, a Schottky barrier will be formed by the transparent electrode and the selenium amorphous chalcogenide layer. It should be noted that the photo-conductive semiconductor material to form the transparent electrode as well as a Schottky barrier is comprised of the aforementioned crystallized selenium, cadmium selenide or amorphous silicon. In FIG. 5, single array of photo-electric converting elements is shown, but a number of such an array may be arranged in a matrix pattern. Shown in FIG. 6 is one example of the photo-electric converting characteristics of the photo-electric converting arrays obtained in the aforementioned manner. In this FIG. 6, a curve "a" shows characteristic of the arrays under the condition where the arrays are not irradiated and a curve "b" shows characteristic of the arrays under the condition where the arrays are irradiated by a daylight fluorescent lamp with the illuminance of 500 lux.

Reference will now be made to another embodiment not shown.

Figure 7:
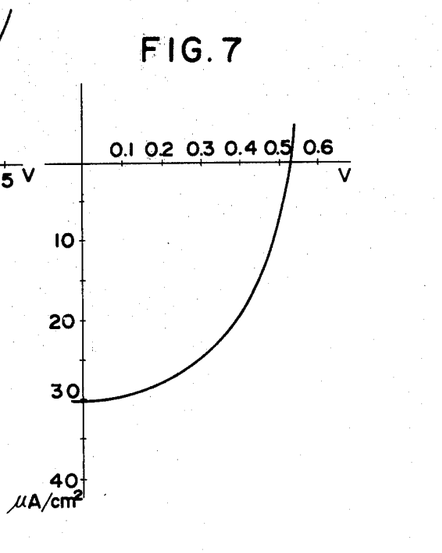

A glass substrate on which a transparent electrode containing tin oxide as a principal component is formed in a preselected pattern, is disposed in an atmosphere of argon to which is added borane of the order of 3% and silane of the order of 10%. The pressure of the atmosphere is reduced to 0.1 torr, the substrate is heated up to 300° C., then glow discharge is established at high frequency whereby a p-type amorphous silicon layer is formed on the transparent electrode. Thereafter an aluminium layer is vacuum deposited thereon to form an upper electrode. The characteristics of a photo-electric converting array containing a Schottky barrier formed by the tin oxide and the p-type amorphous silicon in the manner referred to above is shown in FIG. 7. In this FIG. 7, a curve shows characteristic under the condition where the array is irradiated by a daylight fluorescent lamp with the illuminance of 500 lux.

The photo-electric converting element and the array thereof provided in this manner are extremely suitable for producing the proper electrical output signal from the light input with no external bias voltage being substantially applied between their electrodes.

Figure 8:
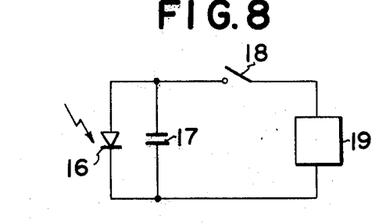
FIG. 8 shows a schematic circuit diagram illustrating the principle of the photo-electric converting apparatus according to the present invention.

Reference will now be made to a fundamental technique to produce the electrical output signal from the light input by using of the aforementioned photo-electric converting element as shown in FIG. 8.

The photo-electric converting element 16 is connected in parallel with a capacitive mean 17 between the anode and the cathode of the element, and is connected to a read out 19 via a switching element 18 arranged to be selectively opened or closed. When the photo-electric converting element 16 is irradiated with light, it produces forward e.m.f. the level of which corresponds to the amount of the light irradiated, and the associated capacitive means 17 is charged. Then the capacitive means will be discharged to the read out 19 by closing the switching element 18 with the scanning pulse. The discharge current is detected by the read out 19 and the electrical pulse signal is outputted. With the use of such photo-electric conversion, it becomes possible to ensure that the pulse signal output is produced with higher reliability every time when the element is irradiated and the dark current is not produced because of interposition of the capacitive means. In addition, the pulse signal output will be produced very rapidly.

Figure 9:
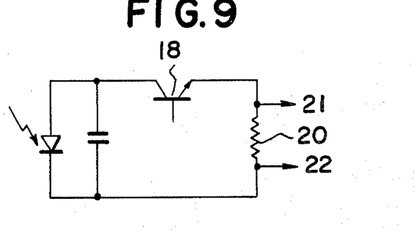
FIG. 9 shows a schematic circuit diagram similar to that shown in FIG. 8, but wherein a transistor element is utilized for a switching element.

In FIG. 9, there is shown a circuit similar to that shown in FIG. 8 except that a transistor is replaced with the switching element 18. The stored electric charge in the capacitive means 17 is transferred to a read out means 20 such as a resistor, by turning the transistor ON with the scanning pulse supplied to its base electrode, and the electrical pulse signal the level of which corresponds to the amount of the light irradiated is outputted between the terminals 21, 22 of the read out means 20.

Figure 10:
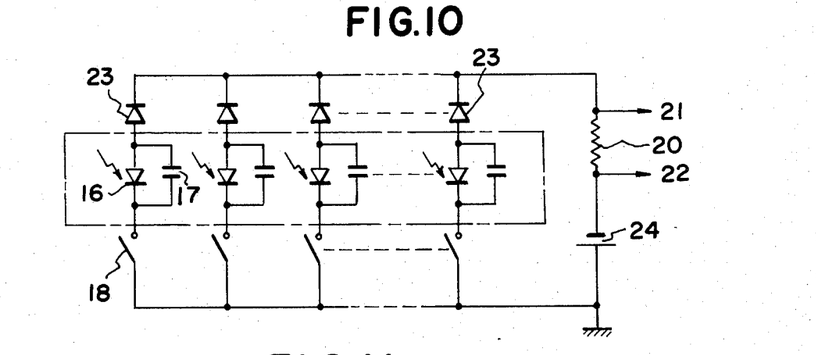
FIG. 10 shows a further schematic circuit diagram illustrating one embodiment of the photo-electric converting array according to the present invention.

FIG. 10 shows a photo-electric converting array 100 wherein a plurality of the photo-electric converting elements 16 and the associated storage capacitive means 17 connected in parallel therewith are provided. In addition, isolation diodes 23 are also provided. The anode of each of the isolation diodes 23 is connected to a junction at which the anode of the photo-electric converting element and the capacitive means are connected together. The cathode of each diode 23 is connected to a common line and the line is connected to one end of the read out means 20. The other end of the read out means 20 is connected to the negative terminal of a DC power source 24 to increase the read out sensitivity, and the positive terminal of the DC power source 24 is grounded. Further, switching elements 18 are provided. One terminal of each of the switching elements is connected to a junction at which the cathode of the photo-electric converting element and the capacitive means are connected together, the other end of each switching element being connected in common and grounded. Since each of the photo-electric converting elements 16 and the associated storage capacitive means is arranged to be isolated at both ends thereof by means of the isolation diode 23 and the switching element 18 respectively, the arrangement discussed above is suitable for providing a photo-electric converting array wherein a plurality of the photo-electric converting elements 16 and associated capacitive means are arranged and connected in the matrix format on the semiconductor substrate. Where a transistor element is used as the switching element 18, the voltage across the DC power source 24 will, for instance, be of the order of, or less than, the saturation voltage of the transistor element used.

Figure 11:
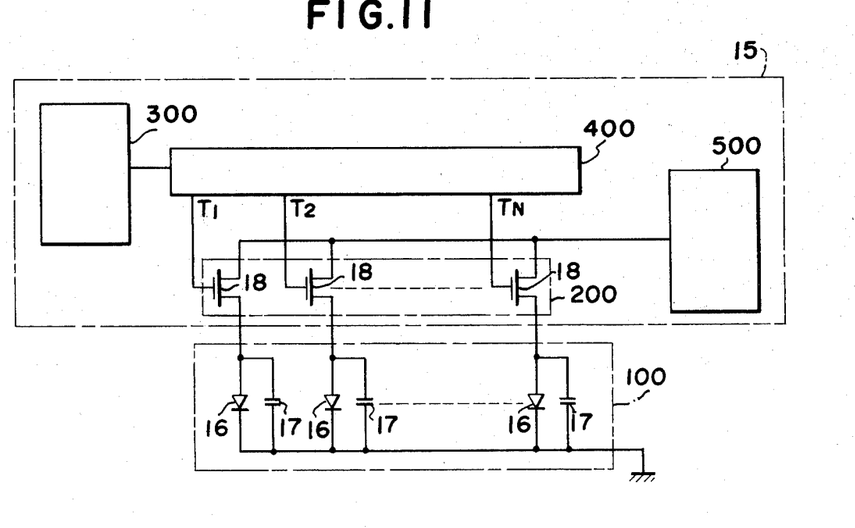
FIG. 11 shows a partially schematic and partially block diagram illustrating one embodiment of the photo-electric converting apparatus according to the present invention.

Referring now to FIG. 11, an integrated scanning circuit 15 is provided preferably on a common silicon semiconductor substrate, the output terminal of a pulse generating circuit 300 in the scanning circuit 15 is connected to the input terminal of a shift register 400. The shift register 400 comprises a plurality of output terminals T1, T2–Tn to produce scanning pulses, each of the output terminals is connected to the gate of each MOS transistor 18 utilized as the switching element. These MOS transistors 18 constitute a switching array 200 and its common output terminal is connected to a signal processing circuit 500. The photo-electric converting array shown in FIG. 11 comprises a plurality of photodiodes 16 and associated capacitive means 17 connected in parallel therewith between the electrodes 12 and 14 of each photodiode. The anode of each of the photoelectric converting diodes 16 is connected to each of the switching elements 18, whilst the cathode thereof is grounded.

Reference will now be made to the operation of the photo-electric converting apparatus.

Figure 12:
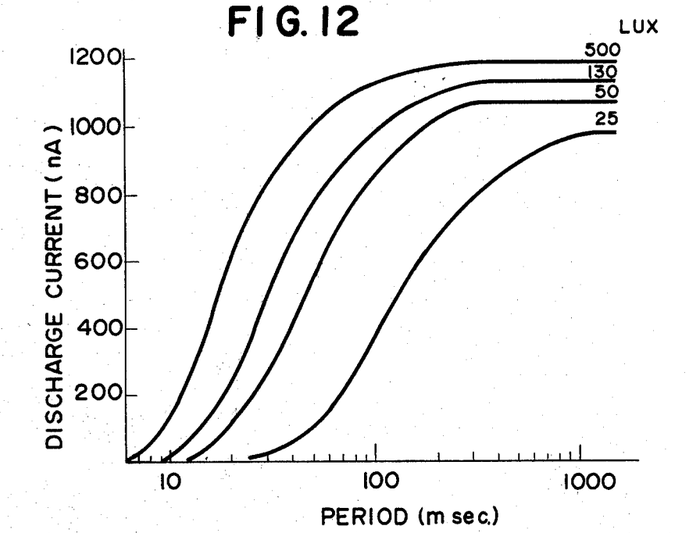
FIG. 12 shows one example of the photo-electric converting characteristic of the photo-electric converting apparatus according to the present invention.

The pulses with predetermined time period generated in the pulse generating circuit 300 are shifted successively in the shift register 400, and the scanning pulses are applied with fixed phase relationship from the output terminal T1, T2–Tn of the shift resistor to each of the gates of MOS transistors 18 to turn ON the transistors successively. Meanwhile, when the photo-electric converting array 100 is irradiated with light with no external voltage being applied to the photo-electric converting array 100 and when the switching array 200 is inactivated or open-circuited, e.m.f. is generated at the Schottky barrier or at the P-N junction of each of the photo-electric converting elements, the level of the e.m.f. corresponds to the amount of light irradiated, and each of the associated capacitive means 17 is charged. When the scanning circuit 15 is operated with at least a slight time delay after the irradiation of light, the charge in each capacitive means 17 is transferred to the signal processing circuit 500 as a timed pulse signal via the closed switching element 18, and such a signal is properly processed in the signal processing circuit 500. It may alternatively be arranged that the e.m.f. produced by light is outputted directly as an electrical signal. In addition, it may be arranged that the capacitance of each of the capacitive means is adjusted so as to adjust the light sensitivity and the exposure to be saturated. FIG. 12 is a graphical representation of one example of the signal obtained in this way. In this graph, the relationship between the discharged current and the time period thereof obtained by a single photo-electric converting element and its associated capacitive means is shown using illuminance of the fluorescent lamp as a parameter.

Figure 13:
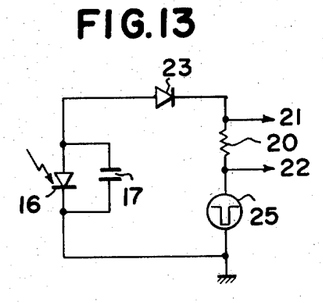
FIGS. 13 and 14 show the basic circuit configurations respectively illustrating the different embodiments of the invention.

The circuit shown in FIG. 13 is provided with a pulse generating means 25 to supply scanning voltage pulses between the cathode side of the photo-electric converting element 16 and the cathode side of the isolation diode 23 such that the cathode side of the diode 23 is negative with respect to the cathode side of the photo-electric converting element 16, the anodes of the element 16 and the diode 23 being connected together. These scanning pulses have an amplitude larger than the threshold level of the isolation diode 23. Accordingly, when the scanning pulses from the pulse generating means 25 are applied via the read out means 20 to the isolation diode 23, it becomes conductive and the stored charge in the capacitive means 17 is discharged to the read out means 20.

Figure 14:
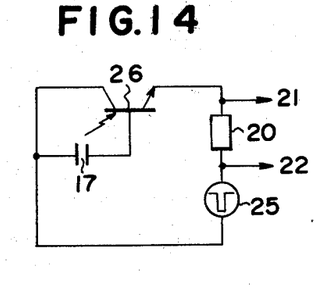

The circuit shown in FIG. 14 comprises a photo-electric converting transistor element 26 which produces e.m.f. when the transistor element is irradiated, as well as a capacitive means 17 connected in parallel across the base and the collector of said transistor element, the emitter of the photo-electric converting transistor element 26 being connected to the pulse generating means 25 via the read out means 20. In this circuit, when the transistor element is irradiated, e.m.f. is produced across said base and said collector, and then the capacitive means 17 is charged in such a polarity that the base side of the transistor element 26 is positive with respect to the collector side of the transistor element 26. Thereafter, when the negative scanning pulses to forward bias the base-emitter of the transistor element 26 are applied from the pulse generating means 25 to the emitter of the photo-electric converting transistor element 26 via the read out means 20, the stored charge in the capacitive means 17 is discharged toward the read out means 20 via the base-emitter of the transistor element 26. Referring to FIG. 14, a PNP transistor can also be utilized instead of said NPN transistor, when the polarity is so arranged similarly that the collector junction serves as a photoelectric converter and the emitter junction as discharging current according to the scanning (positive) pulses.

Figure 15A:
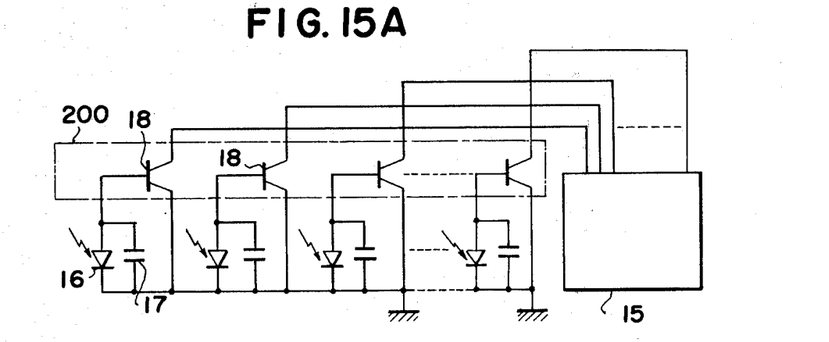
FIG. 15A shows a schematic circuit diagram thereof.
Figure 15B:
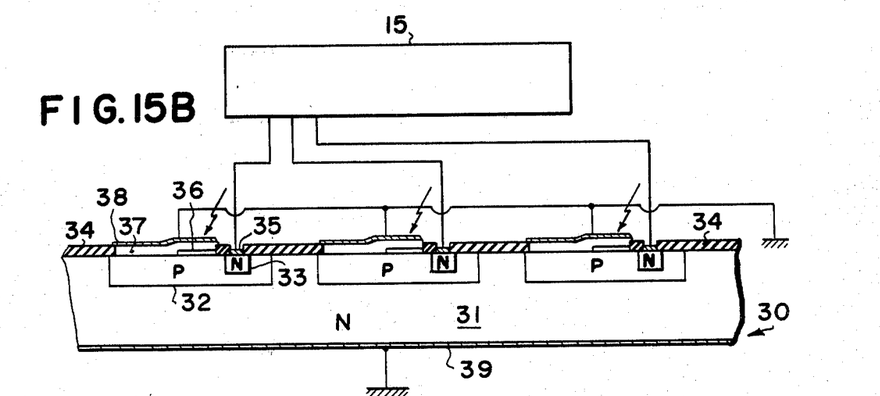
FIG. 15B shows specifically the construction of the semiconductor device.

Reference will now be made to FIG. 15A and FIG. 15B wherein further embodiment of the photo-electric converting apparatus according to the present invention is shown.

In these figures, a switching array 200 comprises a plurality of bipolar transistor elements each of which serves as a switching element 18 and which are one-dimensionally arranged and formed on the same silicon semiconductor substrate 30. A photo-electric converting element 16 and a capacitive means 17 having capacitance preferably of over 10 PF are connected in parallel across the base and the collector of each of the transistor elements 18. Referring now to the construction of this semiconductor device, a plurality of transistor elements are formed on the same side of the substrate 30 by means of conventional integrated circuit processes, each of the transistor element has a collector region 31 of N-type silicon semiconductor substrate 30, a P-type base region 32 formed in said substrate and a N-type emitter region 33 formed in said base region. An insulating film 34, such as $SiO_2$, on the surface of each emitter region 33 is partially removed, then electrode 35 is provided on each emitter region 33 and each of the electrodes 35 so formed is then connected individually to the scanning circuit 15. The insulating film 34 on the surface of each base region 32 is also partially removed, and a cadmium selenide (CdSe) layer 36 of the thickness of 0.01 $\mu$m to 2 $\mu$m is vacuum deposited onto a part of each base region 32. Thereafter a selenium (Se) layer 37 is vacuum deposited on the surface of the remaining parts of each base region 32 and the surface of each cadmium selenide layer 36 in the thickness of the order of 0.2 $\mu$m, then a gold layer is vacuum deposited on each selenium layer 37 to form a gold electrode 38 of the thickness of the order of 1000 Å. The selenium layer 37 is then subjected to heat treatment for about 30 minutes at a temperature of about 220° C. in order to crystallize the selenium layer 37. The semiconductor device having such construction comprises the photo-electric converting elements 16, each of which consisting of the cadmium selenide layer 36 and the selenium layer 37 arranged on the base region (base electrode) of each of the switching transistor elements of the switching array, and the capacitive means 17 each of which comprising the selenium layer 37 as the dielectric material and arranged in parallel with respect to said photo-electric converting element. In this connection, it is to be noted that both of the electrode 38 and the common collector electrode 39 are connected to ground. According to such a construction of the semiconductor device, the capacitive means having capacitance of over 10 PF can relatively easily be incorporated with each photo-electric converting element in parallel. When the light is impinged on the semiconductor device, each of the photo-electric converting elements produces forward electromotive force (e.m.f.) and it is applied to the associated capacitor. When negative scanning pulses are successively applied from the scanning circuit 15 to the respective emitter electrode 35 with the proper phase relationship, each of the switching transistor elements is forward biased successively and the stored charge in each capacitive means is discharged to the scanning circuit 15. The pulses discharged in this way are outputted as timed pulse signals by means of the signal processing circuit (not shown) of the scanning circuit 15.

For convenience in explanation, a semiconductor device having one-dimensional construction was shown in FIG. 15B. It is to be noted, however, that if necessary a semiconductor device having two-dimensional construction can easily be provided in the similar manner.

Figure 16:
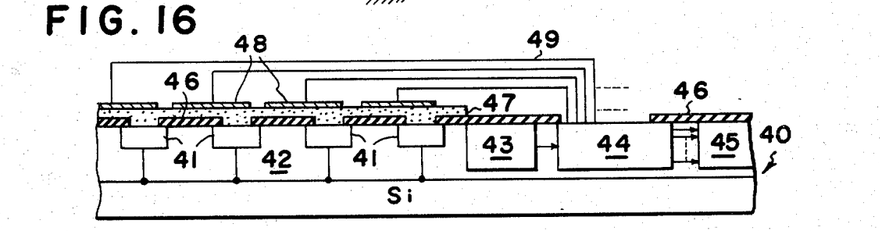
FIG. 16 shows schematically the construction of a integrated semiconductor device of the photo-electric converting apparatus according to the present invention.

FIG. 16 shows an embodiment of an integrated photo-electric converting apparatus with whole of the scanning circuit or a part thereof removed, the reference numeral 40 designating a single silicon semiconductor IC substrate wherein each section 42 consisting of switching elements 41 the number of which correspond to the number of the photo-electric converting elements, a pulse generating section 43, a shift register section 44 and a signal processing section 45 are integrated by means of conventional IC manufacturing techniques. The surface of this silicon semiconductor IC substrate 40 is coated with an insulating film 46 with the exception of windows necessary for required connections. Of course, windows are formed on the insulating film 46 on the surfaces of switching elements 41. Then, photo-electric converting elements are formed on the substrate 40. Although the material for the photo-electric converting element may be any suitable materials such as amorphous chalcogenide, amorphous silicon or the like, the embodiment herein described utilizes $Se_{50}Ge_{10}As_{40}$. This $Se_{50}Ge_{10}As_{40}$ is vacuum deposited on at least the surface of the switching array 42 in the thickness of the order of 1000 to 2000 Å to form a thin film layer 47 for photo-electric conversion. Then, gold is thinly deposited on a portion of the semiconductor the thin film layer 47 over-lying the window of the insulating film on each switching element 41 to provide a rectifying contact therebetween, whereby a gold electrode 48 of the order of 1000 Å is formed. Although the configuration and the dimension of the gold electrode 48 are not critical, it would become necessary to extend each electrode 48 so wide over the surface of the semiconductor thin film layer 47 formed on the insulating film 46, that the required capacitance of the capacitor to be incorporated with each of the photo-electric converting element, formed between each electrode 48 and each switching element 41. In this case, the insulating film and the chalcogenide layer associated with the electrode 48 behave as the dielectric material of the capacitor. Each of the gold electrodes 48 is electrically coupled to the shift register section 44 by means of an aluminium wiring film 49 deposited by a conventional method. Further, the switching elements 41 are coupled together the semiconductor substrate 40 which is grounded, and the required connections are made between the pulse generating section 43 and the shift register section 44, and between the shift register section 44 and the signal processing section 45. In general, due to the larger resistivity of the chalcogenide layer, each of the photo-electric converting film is not necessarily incorporated in separate areas, but may be formed in a single continuous layer. The capacitance of the capacitor to be incorporated with each of the photoelectric converting elements is preferably of over about 10 PF, in view of the detection sensitivity.

Figure 17:
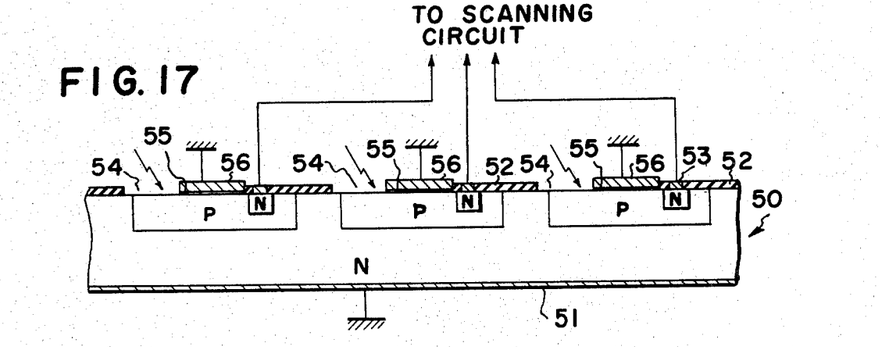
FIG. 17 shows schematically the construction of the photo-electric converting section provided with a switching section.

FIG. 17 shows a concrete construction of the semiconductor device with respect to the circuit shown in FIG. 14, the reference numeral 50 designating a silicon semiconductor substrate wherein a plurality of photoelectric converting transistor elements are formed by means of conventional IC method. The collector of each of the transistor elements are commonly coupled by means of the electrode 51 which is grounded. In the N-type emitter region of each of the photo-electric converting transistor elements, an electrode 53 is formed through the window of the insulating film 52. A thin film 55 of higher dielectric constant such as titanium oxide is formed on the surface of the P-type base region of each of the photo-electric converting transistor elements, with the exception of the portion 54 on which the light is impinged. Preferably, the dielectric thin film 55 is formed on the surface of the P-type base region adjacent to the N-type emitter region. Then, an electrode 56 is formed on each of the dielectric thin film 55 by means of conventional method and these electrodes 56 are commonly coupled and grounded. The electrode 56, the dielectric thin film 55 and the surface of the P-type base region provide the capacitor between the base and the collector of each photo-electric converting transistor element in parallel. Each of the dielectric thin film 55 is formed such that the capacitor discussed above may be of the capacitance of preferably over 10 PF. When the light is impinged on the semiconductor substrate of the type explained above, electromotive force is produced by each of the photo-electric converting transistor elements, which is tending to flow a current from the P-type base region thereof through the dielectric thin film 55, the electrode 56 and the ground to the N-type collector region of each transistor element, whereby the charge is stored in each capacitor consisting of each dielectric thin film 55. Thereafter, negative scanning pulses are applied from the scanning circuit (not shown) to each of the emitter electrodes 53 successively with a fixed phase relationship, then the transistor elements are forward biased, and the stored charges are discharged successively to the scanning circuit via the forward biased transistor elements.

Figure 18:
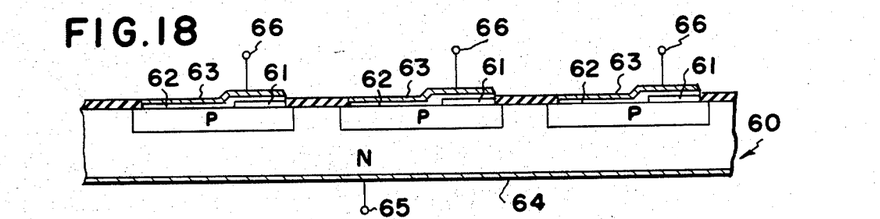
FIG. 18 shows schematically the construction of a further embodiment of the photo-electric converting array.

FIG. 18 shows a diode array semiconductor substrate 60 wherein a plurality of isolation diode elements are formed by means of conventional IC method. A cadmium selenide layer (CdSe) 61 and a selenium layer 62 are formed on each of the P-type conductive region which acts as the anode of each diode element in said substrate, in the same manner as that shown in FIG. 15B, and a thin gold electrode layer 63 is formed thereon to constitute a photo-electric converting array. The cathode of this photo-electric converting array is commonly coupled by means of a cathode electrode 64, and a terminal 65 for taking out the stored charge is formed on the cathode electrode 64. Whilst, a terminal 66 which is to be connected to, for instance, a switching element, is provided on each electrode 63 which acts as a common electrode of the photo-electric converting element and the capacitor connected in parallel therewith.

Although the invention has been described with a certain degree of particularlity, it is understood that the present disclosure is made only by way of example and that numerous changes in the details of construction and the combination and arrangement of parts may be resorted to without departing from the spirit and the scope of the invention, reference for the latter being had to the appended claims.

We claim:

1. A photo-electric converting apparatus comprising a substrate, a plurality of photo-electric converting elements arranged on said substrate said photo-electric converting elements including electrode layers at least one of which is transparent and a semiconductor film layer interposed between said electrode layers and having a rectifying contact or junction with the electrode layers, capacitive means arranged in parallel with said photoelectric converting elements, respectively, to form circuits for storing electric signals corresponding to light information, and a read-out arranged to include the above capacitive means in common with said respective circuits, with light under such condition that substantially no voltage is applied across the electrode layers of said photoelectric converting elements and said respective capacitive means are electrically charged with the photo-current produced at the outputs of the respective photo-electric converting elements under the action of the electromotive force induced at said rectifying contact or junction of the respective photoelectric converting elements, with its higher energy level side being positive and lower side being negative, owing to the light incident thereupon, so that the charges stored in said capacitive means are successively and periodically discharged under the action of scanning pulses to said read-out, whereby light signals are converted into periodic timed pulse signals.

2. A photo-electric converting apparatus according to claim 1, comprising diodes connected in series with the photo-electric converting elements, respectively, in such a polarity that the discharging current of each capacitive means flows in the forward direction of the respective diode, so that the scanning pulses are applied through these diodes.

3. A photo-electric converting apparatus according to claim 1, comprising a semiconductor substrate including at least one switching array of elements formed thereon and an insulating film thereon having windows for making required connections, a photo-electric converting semiconductor film formed on the selected surface of said semiconductor substrate at least partly including the area corresponding to said switching array of elements, said semiconductor film extending onto the switching element surface of said switching array of elements at the windows of said insulating film, and electrodes at least formed on the selected positions of said photo-electric converting semiconductor film layer at least partly including the area corresponding to the windows, wherein said plurality of photo-electric converting elements and the capacitive means arranged in parallel therewith are so formed on said semiconductor substrate that they cooperate with at least one of said switching array.

4. A photo-electric converting apparatus comprising a photo-electric converting array including a semiconductor substrate, a plurality of photo-electric converting transistor elements, formed on said substrate and capacitive means connected in parallel between the collectors and bases of said respective photoelectric converting transistor elements, wherein light is incident upon the parts between the collectors and bases of said photo-electric converting transistor elements while periodic scanning pulses are applied successively to the emitters of the respective photo-electric converting transistor elements, and the respective capacitive means are electrically charged with the current produced under the action of the electromotive force induced in the respective photoelectric converting transistor elements by irradiating said photo-electric converting array under such condition that substantially no bias voltage is applied thereto, so that the charges stored in said capacitive means are successively and periodically discharged under the action of said scanning pulses and the discharged pulses are fed to the common output terminal of said apparatus, from which the timed pulse signals are obtained.

5. A photo-electric converting element or an array formed thereby, including a substrate, electrode layers arranged thereon at least one of which is a transparent electrode layer, and hetero-junction, principally including selenium and cadmium selenide junction, formed between said electrodes, which comprises a cadmium selenide layer having a thickness of about 0.01 $\mu$m–2 $\mu$m formed on one of said electrode layers and a crystallized selenium layer having a thickness of about 0.01 $\mu$m–4 $\mu$m formed on said cadmium selenide layer, said crystallized selenium layer having ohmic contact with the other of said electrode layers.

6. A photo-electric converting apparatus according to claim 1, including a cadmium selenide layer having a thickness of about 0.01 $\mu$m–2 $\mu$m and a selenium layer having a thickness of about 0.01 $\mu$m–4 $\mu$m.

7. A photo-electric converting apparatus according to claim 1, wherein the semiconductor film layer having rectifying contact with the transparent electrode layer is formed of amorphous selenium or selenium chalcogenide.

8. A photo-electric converting apparatus according to claim 1, wherein the semiconductor film layer is formed of amorphous silicon layer having rectifying contact with the transparent electrode or amorphous silicon layer having P-N junction.

* * * * *